United States Patent [19]
Guidash

[11] Patent Number: 6,127,697
[45] Date of Patent: *Oct. 3, 2000

[54] CMOS IMAGE SENSOR

[75] Inventor: Robert M. Guidash, Rush, N.Y.

[73] Assignee: Eastman Kodak Company, Rochester, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/970,550

[22] Filed: Nov. 14, 1997

[51] Int. Cl.$^7$ .................. H01L 31/062; H01L 31/113; H01L 27/148; H01L 29/768

[52] U.S. Cl. .................. 257/292; 257/290; 257/291; 257/233

[58] Field of Search .................. 257/233, 292, 257/290, 291

[56] References Cited

U.S. PATENT DOCUMENTS

| | | | |
|---|---|---|---|
| 4,484,210 | 11/1984 | Shiraki et al. | 357/24 |
| 5,238,864 | 8/1993 | Maegawa et al. | 437/53 |
| 5,625,210 | 4/1997 | Lee et al. | 257/292 |
| 5,675,158 | 10/1997 | Lee | 257/233 |
| 5,698,874 | 12/1997 | Hayashi | 257/233 |
| 5,712,497 | 1/1998 | Watanabe et al. | 257/218 |
| 5,898,196 | 4/1999 | Hook et al. | 257/292 |
| 5,903,021 | 5/1999 | Lee et al. | 257/292 |

FOREIGN PATENT DOCUMENTS

| | | | |
|---|---|---|---|
| 0 450 827 A1 | 3/1991 | European Pat. Off. | H01L 27/144 |
| 0 738 010 A2 | 10/1996 | European Pat. Off. | H01L 27/148 |
| 0 763 855 A2 | 3/1997 | European Pat. Off. | H01L 29/78 |
| 403289173 | 12/1991 | Japan | 257/233 |

OTHER PUBLICATIONS

128+128 CMOS Photodiode–Type Active Pixel Sensor With On–Chip Timing, Control And Signal Chain Electronics, by R. H. Nixon et al.

Technology And Device Scaling Considerations For CMOS Imagers, by Wong.

Active Pixel Sensors: Are CCD'S Dinosaurs?, by Eric R. Fossum.

A Small Pixel CMD Image Sensor, by Ogata et al.

A 250,000–Pixel Image Sensor With Fet Amplification At Each Pixel For High–Speed Television Cameras, by Andoh et al.

An 800K–Pixel Color CMOS Sensor For Consumer Still Cameras, by Hurwitz et al.

A 1/4 Inch 330k Square Pixel Progressive Scan CMOS Active Pixel Image Sensor, by Oba et al.

*Primary Examiner*—David Hardy
*Assistant Examiner*—Jesse A. Fenty
*Attorney, Agent, or Firm*—James D. Leimbach

[57] ABSTRACT

An active pixel sensor comprising: a substrate of a first conductivity type having a surface containing PMOS and NMOS implants that are indicative of a sub-micron CMOS process; a photodetector formed at a first depth from an implant of a second conductivity type that is opposite the first conductivity type on the surface; a gate on the surface adjacent to the photodetector; and wherein the photodetector is formed by an implant of the second conductivity that is deeper and more lightly doped than implants used within the sub-micron CMOS process. The sensor has the photodetector is formed by an implant angled towards the gate. The preferred embodiment of the sensor further employs a pinning layer formed at a second depth that is less than the first depth from the first conductivity type more near the surface than the photodetector.

7 Claims, 1 Drawing Sheet

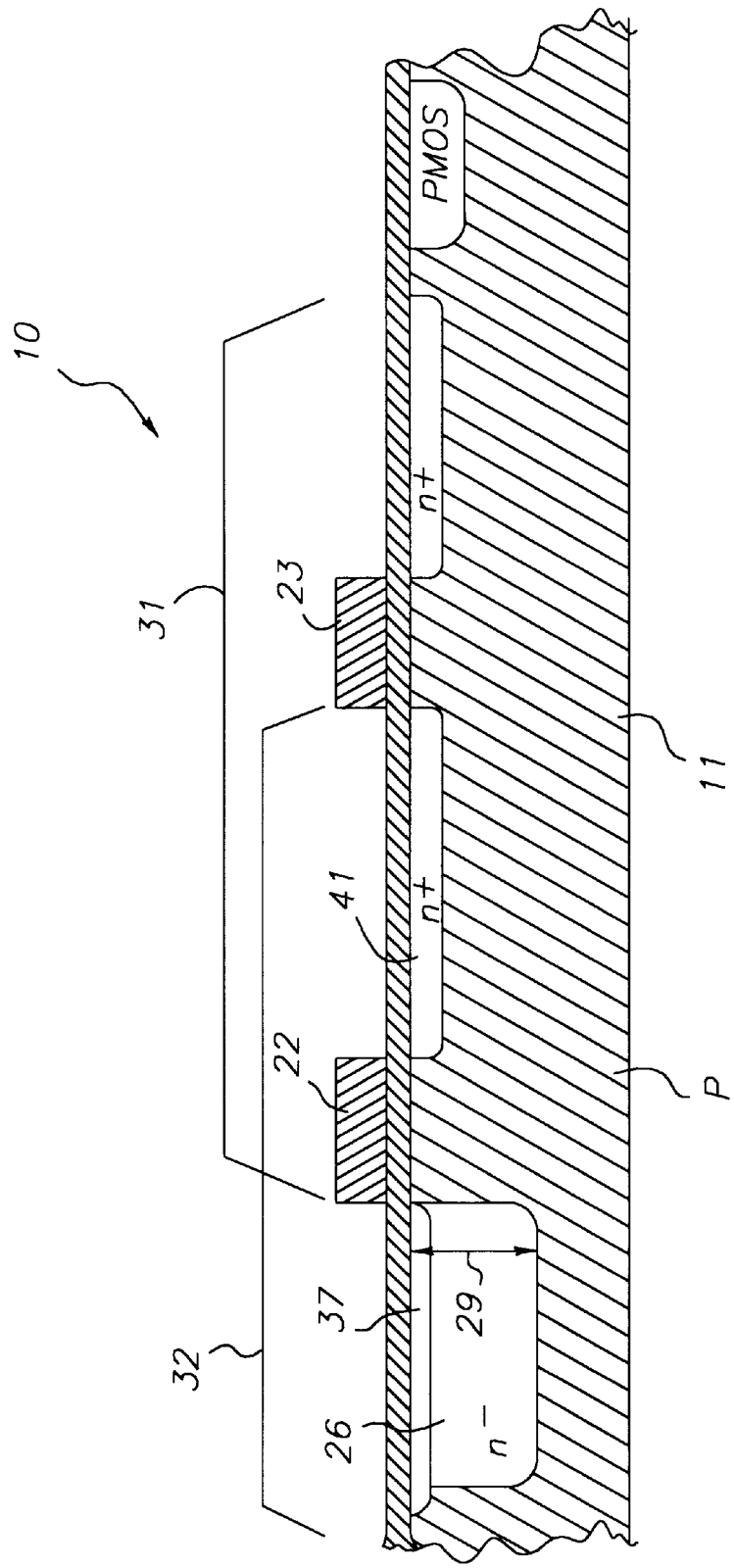

CMOS IMAGE SENSOR

CROSS REFERENCE TO RELATED APPLICATIONS

This application is related to an application entitled METHOD OF FORMING A SEMICONDUCTOR IMAGE SENSOR AND STRUCTURE by Drowley et al and filed concurrently herewith.

FIELD OF THE INVENTION

This invention relates, in general, to semiconductor image sensors, and more particularly to a CMOS based image sensor.

BACKGROUND OF THE INVENTION

In the past, a variety of methods were used to form semiconductor image sensors on a substrate with complimentary metal oxide semiconductor (CMOS) devices. Typically, the optical receiving portion of the sensor is formed either as a gate of a large area transistor, often referred to as a photo-gate, or as a source-drain junction of a metal oxide semiconductor (MOS) transistor. The photo-gate transistor implementation requires that light travel through the silicon gate of the transistor in order to convert light to electrical energy. Consequently, the photo-gate implementation has reduced sensitivity. Additionally, the depletion region generally is shallow (less than one micron) thereby reducing the collection efficiency of carriers induced by red light absorption. Also, conventional photogate implementations are susceptible to noise created by surface recombination.

The source-drain junction implementation generally has a junction that is optimized for transistor operation and therefore also has a shallow junction that results in efficient collection of carriers induced by red light. Another disadvantage of the source-drain junction implementation is that the junction typically is formed in a highly doped (greater than $10^{16}$ atoms/cm$^3$) region that limits the width of the junction depletion region thereby further reducing the collection efficiency of carriers induced by red light absorption. Furthermore, forming the junction in such a highly doped region results in a large capacitance that reduces the amount of charge that can be transferred from the photo sensing element producing image lag artifacts. Additionally, such highly doped regions typically have high dark current, leading to high dark noise. Other implants in sub-micron CMOS processes that could be used as a photodiode that are lightly doped are too shallow. Those that are deep enough are too heavily doped.

Accordingly, it is desirable to have an image sensor that does not utilize a photo-gate thereby resulting in higher efficiency, that does not have a shallow junction depth thereby increasing efficiency, that minimizes noise from surface recombination and that has a more lightly doped profile.

SUMMARY OF THE INVENTION

The shortcomings of the prior art are addressed by the present invention which in the preferred embodiment provides an active pixel sensor comprising: a substrate of a first conductivity type having a surface containing PMOS and NMOS implants that are indicative of a sub-micron CMOS process; a photodetector formed at a first depth from an implant of a second conductivity type that is opposite the first conductivity type on the surface; a gate on the surface adjacent to the photodetector; and wherein the photodetector is formed by an implant of the second conductivity that is deeper and more lightly doped than implants used within the sub-micron CMOS process. The sensor has the photodetector is formed by an implant angled towards the gate. The sensor further can comprise a pinning layer formed at a second depth that is less than the first depth from the first conductivity type more near the surface than the photodetector.

BRIEF DESCRIPTION OF THE DRAWINGS

FIG. 1 illustrates an enlarged cross-sectional portion of an image sensor embodiment in accordance with the present invention.

DETAILED DESCRIPTION OF THE INVENTION

FIG. 1 illustrates an enlarged cross-sectional portion of a semiconductor image sensor 10. Sensor 10 includes an underlying P-type substrate 11 formed using a conventional CMOS process with additional N-type implants to create photodiodes that are not conventional CMOS implants. These N-type implants are deeper and more lightly doped than implants typically employed by CMOS processes. Typically, within a sub-micron CMOS process, shallow implants (those between ½–¼ microns) are doped with impurity concentrations on the order greater than $10^{18}$ impurity particles per cm$^3$. Also, shallow implants within a sub-micron CMOS process may be very lightly doped on the order of less than $10^{15}$ dopant impurities per cm$^3$. A deep implant within a sub-micron CMOS process (an implant greater than one micron) is typically doped on the order of $10^{17}$ dopant impurities per cm$^3$. The present invention envisions creating at least one implant (the preferred embodiment teaches an N-type implant) that is deeper and more lightly doped than implants typically employed by sub-micron CMOS processes. The present invention envisions employing an implant at least one micron in depth having a doping concentration on the order of $10^{15}$ to $10^{16}$ dopant impurities per cm$^3$. The present invention envisions employing these types of implants within a CMOS environment to create photodetectors within a modified CMOS process.

The image capturing or light sensing element of sensor 10 includes an N-type conducting region 26 that is formed in the substrate 11. Conducting region 26 forms a P-N junction with the P-type material of substrate 11. This P-N junction is positioned at a depth 29 of conducting region 26 in order to efficiently collect photoelectrons in the green and red wavelength of the light spectrum and is at a depth that is greater than implants typically used for CMOS device fabrication. The actual depth is dependent upon the specific CMOS technology employed. Additionally, the N-type conducting region is more lightly doped than implants typically employed by CMOS fabrication processes in order to provide lower dark current by complete elimination of implant damage. In the preferred embodiment a P-type pinning layer 37 is formed within region 26 and extends outward from region 26 into substrate 11 in order to form an electrical connection therewith. A more lightly doped N-type region simplifies creation of the pinning layer. While P-type pinning layer 37 is employed within the preferred embodiment, it will be understood by those skilled in the art that N-type region 26 forming the photodiode can be used without a pinning layer. There is an electrical connection formed by the pinning layer that pins the surface potential to the substrate potential of the image sensor. Consequently, the resulting photodiode is often referred to as a pinned photodiode. The second P-N junction created by the pinning layer 37 is formed along the intersection of layer 37 and region 26. Typically layer 37 is formed simultaneously with the formation of lightly doped drain and source regions of other P-channel MOS transistors (not shown) on substrate 11. The depth of the second P-N junction is less than that of the first P-N junction 29. This depth is selected to optimize the absorption or sensing of light in the blue wavelengths. Since the pinning layer 37 is shallow and more heavily doped, it can be formed by methods other than implantation. A transfer transistor or first MOS transistor 32 is formed adjacent to conducting region 26 so that a portion of region 26 forms a source of transistor 32. A second or reset MOS transistor 31 is formed within substrate 11. Transistor 31 has a source that is electrically coupled to transistor 32 by a coupling region 41.

Conducting region 26 is formed by applying a mask having an opening that exposes some of the substrate 11 extending up to and including a portion of a gate 22 or transistor 32. Then dopants are implanted at an angle toward gate 22 to ensure that region 26 extends under gate 22, thereby saving masking and other processing operations in forming region 26 and the source of transistor 32. It is envisioned that the conducting region 26 be formed by an implant in order to create a region with sufficient depth and desired doping level given the short and low thermal sequences of sub-micron CMOS processes.

By now it should be appreciated that there has been provided a novel image sensor and method therefor. Forming a deep conducting region and a shallower pinned layer forms two P-N junctions where one P-N junction, and the associated depletion region, is deep to facilitate capturing light in the red and green wavelengths and a second P-N junction, and the associated depletion region, is shallow facilitating capturing blue wavelength light. This structure also minimizes bulk dark current as well as surface recombination and maximizes charge transfer. Using an angled implant to form the conducting region ensures the conducting region can be used as a source of a charge transfer transistor thereby minimizing manufacturing operations.

PARTS LIST
10 sensor
11 substrate
26 conducting region
29 depth
31 transistor
32 MOS transistor
37 pinning layer
41 region

What is claimed is:

1. An active pixel sensor comprising:

a substrate of a first conductivity type having a surface containing at least one PMOS implant and at least one NMOS implant that are made from a sub-micron CMOS process;

a photodetector formed at a first depth from an implant of a second conductivity type that is opposite the first conductivity type on the surface;

a gate on the surface adjacent to the photodetector formed such that that it at least partially overlaps the implant used to form the photodetector; and wherein the photodetector is formed by an implant of the second conductivity that is at least one micron in depth and doped at a concentration of $10^{15}$ to $10^{16}$ dopant impurities per $cm^3$.

2. The sensor of claim 1 wherein the partial overlap of the photodetector is formed by an implant angled towards the gate.

3. The sensor of claim 2 further comprising a pinning layer formed at a second depth that is less than the first depth from the first conductivity type more near the surface than the photodetector.

4. An active pixel sensor comprising:

a substrate of a first conductivity type;

a gate on a surface of the substrate; and a photodetector formed from a second conductivity type that is opposite the first conductivity type formed via an angled implant with respect to the gate such that the angled implant extends underneath the gate.

5. The active pixel sensor of claim 4 further comprising:

the substrate of the first conductivity type has a surface containing a plurality of PMOS implants and a plurality of NMOS implants formed from a sub-micron CMOS process;

the gate on the surface adjacent to the photodetector formed such that that it is at least partially overlaps the implant used to form the photodetector; and wherein the photodetector is formed by an implant of the second conductivity that is deeper and more lightly doped than the PMOS and NMOS implants.

6. The invention of claim 5 wherein the implant used to make the photodetector implant has a doping concentration within a range of $10^{15}$ to $10^{16}$ dopant impurities per $cm^3$.

7. The invention of claim 4 wherein the implant used to make the photodetector further comprises an implant at least one micron in depth.

* * * * *